May 6, 1969 R. BÄUERLEIN ET AL 3,442,722

METHOD OF MAKING A $_{pnpn}$ THYRISTOR

Filed Oct. 21, 1965

United States Patent Office 3,442,722
Patented May 6, 1969

3,442,722
METHOD OF MAKING A pnpn THYRISTOR

Rudolf Bäuerlein, Erlangen, and Kurt Raithel, Uttenreuth, Germany, assignors to Siemens Aktiengesellschaft, Berlin-Siemensstadt, Germany, a corporation of Germany
Filed Oct. 21, 1965, Ser. No. 500,393
Claims priority, application Germany, Dec. 16, 1964, S 94,642
Int. Cl. H01l 11/10, 7/54
U.S. Cl. 148—178 4 Claims

ABSTRACT OF THE DISCLOSURE

Described is a method of producing pnpn thyristors. This method comprises indiffusing, into a middle p-conducting region serving as a p-base, recombination material up to the innermost pn-junction, and forming recombination centers in the inner n-conducting region, serving as an n-base, by corpuscular radiation, with particle energies greater than ½ mev. and a radiation dosage between 1 and 1000 $\mu$a. sec./cm.$^2$.

Figure 1:
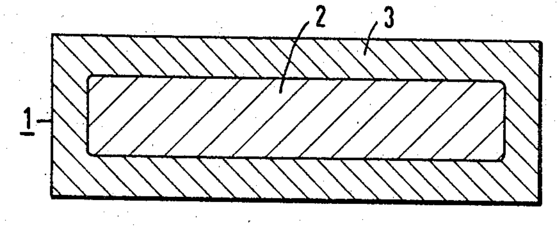

Thyristors, of pnpn-type, consist of an essentially monocrystalline semiconductor body containing four regions of alternating conductance type. Each region is separated from each other by pn-junctions.

There are several known methods for making thyristors. For instance, conventionally, a disc-shaped semiconductor body of a certain conductance type, e.g. n-type silicon, is used as the starting body. Into this body doping material is indiffused from all sides, thus forming a peripheral zone of opposite conductance type completely surrounding the first zone. By subdividing this peripheral zone into two regions, a three-layer member is formed. A fourth layer is produced in the body by alloying an electrode, containing doping material, onto one flat side of the member formed from the disc-shaped semiconductor body. This flat side is usually opposite that which is subdivided. The doping material in the last alloyed electrode again produces the original conductance type of the semiconductor body in the recrystallization layer formed under the eutectic electrode. It is possible, for instance, to produce a p-conducting region directly beneath the surface of the semiconductor body by indiffusion of aluminum, gallium or boron from all sides into an n-conducting silicon body. This p-conducting region can be divided into two separate regions by etching a continuous cut therein. A foil of n-conductance producing material can subsequently be alloyed in along the surface of one of the two p-conducting regions to produce an n-conducting region with a contact electrode on top thereof.

Our invention has as an object the improvement to the manufacturing technique so that we can in a simple manner produce a thyristor which has the shortest possible turn-off time and whose forward voltage drop does not rise to excessive values. "Turn-off time" is the time interval, following the cessation of forward conductance of the thyristor, which must elapse before the full blocking voltage in the forward direction can be reapplied to the thyristor without causing it to fire and hence become conductive. The free charge carriers must be destroyed or removed in the shortest possible time after cessation of current in order to obtain short turn-off times. The area around the middle pn-junction of the thyristors essentially determines the turn-off time. If there are sufficient recombination centers within this area to destroy the charge carriers after current flow stops, the full blocking ability of this pn-junction is reestablished within a relatively short time. It has been proposed to vapor-deposit an impurity, such as gold, which forms recombination centers, onto the flat side of a semiconductor disc or wafer of e.g. silicon. A "wafer" is a disc-shaped semiconductor body. The deposit is then indiffused to the middle pn-junction. After the prescribed diffusion depth has been reached, the diffusion temperature is suddenly lowered.

The present invention produces thyristors with a short turn-off time and small forward voltage by producing the recombination centers in the n-conducting region, bordering the middle pn-junction, by an energy-rich corpuscular radiation. Material producing recombination centers is diffused into the p-conducting region which borders on the middle pn-junction from the flat side of the semiconductor body which is located on the same side as the p-conducting region. Thyristors produced under such conditions possess, as well as a sufficiently high blocking voltage in forward direction, undisturbed and temperature-stable characteristics.

The introduction of recombination centers into the n-conducting region does not influence the recombination centers in the p-conducting region. It is possible, therefore, first to adjust the most favorable concentration of recombination centers in the p-conducting region in order to obtain the shortest possible turn-off times therein, and subsequently to do the same in the n-conducting region without affecting the concentration of the recombination centers in the p-conducting region. It is also possible to bring the recombination centers into the n-conducting region after completing the whole semiconductor component.

Our invention is thus characterized by the fact that recombination centers forming material is diffused into the middle p-conducting region, acting as a p-base at least in the area of the middle pn-junction. Recombination centers are produced in the middle n-conducting region, serving as n-base, by corpuscular radiation, preferably electron radiation, with particle energies in excess of ½ mev. and a radiation dosage of between 1 and 1000 $\mu$a. sec./cm.$^2$.

The invention will be further described with reference to the drawing and a typical embodiment.

In the drawing, FIGS. 1 to 4 represent each step of producing a thyristor according to our invention, starting from a monocrystalline semiconductor disc or wafer 1. The semiconductor body is always shown in section. For reasons of clarity, the thickness ratios in particular are distorted and the scale for thickness and width was chosen very discriminately.

FIG. 1 starts with a disc-shaped semiconductor body or wafer 1 made, for instance, of n-conducting silicon with a specific resistance of from 20 to 40 ohm/cm. This wafer is about 300$\mu$ thick and 18 mm. in diameter. A p-conductance producing material such as aluminum, gallium or boron is diffused into this n-conducting semiconductor body from all sides. To accomplish this, a number of semiconductor wafers together with the doping source are placed into a quartz ampule. The quartz ampule is then sealed and heated up to the diffusion temperature. This causes the p-conductance producing material to be indiffused in all sides of the semiconductor wafer. For instance, aluminum can be indiffused at 1230° C. in 35 hours. The result is a p-conducting peripheral region 3 of about 70$\mu$ thickness, enclosing a core region 2, which remains n-conducting.

It is also possible to indiffuse aluminum and gallium simultaneously or sequentially, for instance aluminum at 1230° C. for 8 hours and subsequently gallium for 30 hours, whereby the gallium source is maintained at 950° C. and the silicon discs at a temperature of 1230° C.

Figure 2:
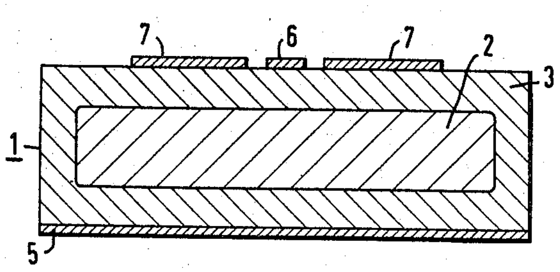

Upon termination of the diffusion process, an aluminum foil 5, shown in FIG. 2, of an appropriate thickness of 50$\mu$ is alloyed in onto one flat side, while a boron-containing gold foil 6 of 5 mm. diameter and a ring-shaped antimony-containing gold foil 7 surrounding foil 6 are alloyed in onto the other flat side of the semiconductor wafer 1. The gold foils 6 and 7 can have a thickness of about 40μ. All foils are alloyed in in a single process. According to the invention, the alloying temperature is between 750 and 800° C., the alloying time from 5 to 30 minutes. An alloying temperature of 780° C. and an alloying time of 20 minutes were found to be most favorable.

Figure 3:
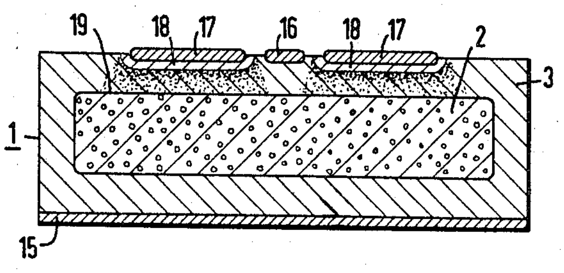

FIG. 3 shows a finished semiconductor component upon termination of the alloying process. An emitter electrode 15 produced from the aluminum foil 5 covers one flat side of region 3, while barrier-free base electrode 16 produced from foil 6 contacts region 3. Emitter electrode 17 was produced from foil 7. This electrode 17 is in contact with a new region 18, consisting of the recrystallization layer, showing n-conductance. During the alloying process, a quantity of gold atoms are diffused from the disc-shaped foil 7 to the region of the middle pn-junction. These recombination center forming gold atoms are represented in FIG. 3 by dots in p-conducting region 3 under the emitter electrode 17 and n-conducting region 18. The concentration of gold atoms continuously increases from the middle pn-junction 19 to the pn-junction between the p-conducting region 3 and the n-conducting region 18.

Figure 4:
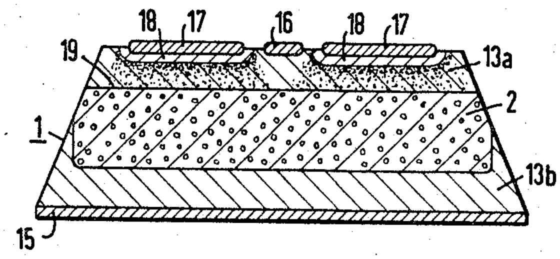

Subsequent to the alloying process, the semiconductor body 1, now containing the electrodes 15, 16 and 17, is subjected to corpuscular radiation, according to the invention. Corpuscular radiation is also understood to comprise gamma quantums, which are created, for instance, by the disintegration of cobalt 60. The corpuscular radiation may also consist of fast neutrons furnished from a nuclear reactor. Protons to a smaller degree are also useful. A corpuscular radiation consisting of energy-rich electrons which possess at least a kinetic energy of ½ mev. is particularly useful. The radiation dosage lies between 1 and 1000μa. sec./cm.$^2$. The semiconductor wafer 1 of about 300μ thickness was exposed to radiation with a radiation dosage of 30μa. sec./cm.$^2$, consisting of electrons with a kinetic energy of ¾ mev. For this purpose, an electron stream, for instance, from a Van-de-Graaff accelerator was directed perpendicularly to the flat side of the semiconductor body equipped with electrodes 16 and 17. The energy-rich corpuscular radiation, in this case an electron radiation, produces grid faults, particularly in the n-conducting region, which act as recombination centers for charge carriers. In FIGS. 3 and 4, recombination centers created by corpuscular radiation in the n-conducting core region 2 are indicated by small circles. Similarly, the necessary recombination centers in semiconductor body 1 can also be attained by radiating the semiconductor body 1 with gamma radiation of $10^6$ to $10^7$ roentgen, from a cobalt-60 source.

Before or after radiation with high-energy corpuscules, the entire margin of the disc-shaped semiconductor body 1 can be removed by a milling or sand-blasting process, whereby the p-conducting region 3 is subdivided into two regions **13*a* and 13*b*. FIG. 4 shows the finished semiconductor component. The p-conducting region 3 can also be divided into two p-conducting subregions by a groove which completely surrounds the ring-shaped annular electrode 17 outside of the n-conducting region 18. This groove can be produced mechanically or by an etching process and extends to the n-conducting core region 2.**

Silicon thyristors produced according to the invention have turn-off times below 50 microseconds and a forward voltage of about 1.2 v. at 300 a. forward current. The recombination centers caused by corpuscular radiation have proved to be stable under maximum operational temperature (ca. 150° C.).

Obviously many modifications and variations of the present invention are possible in the light of the above teachings. It is therefore to be understood that within the scope of the appended claims, the invention may be practiced otherwise than as specifically described.

We claim:

1. A method of producing pnpn thyristors which comprises indiffusing into a middle p-conducting region, serving as a p-base, recombination material up to the innermost pn-junction, and forming recombination centers in the inner n-conducting region, serving as an n-base, by corpuscular radiation, with particle energies greater than ½ mev. and a radiation dosage between 1 and 1000 μa. sec./cm.$^2$.

2. The method of making a pnpn silicon thyristor with a semiconductor body of four regions of alternating type, separated from each other by pn-junctions, which comprises indiffusing gold into the inner p-conducting region of the semiconductor body to act as recombination centers, the indiffusing of gold occurring by alloying an antimony-containing annular foil onto one flat surface of said semiconductor body at a temperature from 750° C. to 800° C. for a period between 5 and 30 minutes and forming recombination centers in the inner n-conducting region, serving as an n-base, by corpuscular radiation, with particle energies greater than ½ mev. and a radiation dosage between 1 and 1000 μa. sec./cm.$^2$.

3. The method of making a pnpn thyristor which comprises forming in a silicon semiconductor body or wafer four regions of alternating p, n, p, n separated from each other by pn-junctions, indiffusing gold into the inner p-conducting region of the semiconductor body to act as recombination centers, the indiffusing of gold occurring by alloying an antimony-containing annular foil onto one flat surface of said semiconductor body at an alloying temperature of 780° C. for about 20 minutes and thereafter exposing the body to a substantially mono-energetic electron radiation with a particle energy of ¾ mev. and a radiation dosage of 30 μa. sec./cm.$^2$.

4. The method of claim 3, wherein the original n-type silicon was about 300μ thick, in which a p-type peripheral base of about 70μ was formed.

References Cited

UNITED STATES PATENTS

| | | | |
|---|---|---|---|
| 3,272,661 | 9/1966 | Tomono et al. | 148—1.5 |
| 3,317,359 | 5/1967 | Engbert | 148—186 |
| 3,341,754 | 9/1967 | Kellett et al. | 148—1.5 |
| 3,356,543 | 12/1967 | Desmond et al. | 148—186 |

RICHARD O. DEAN, *Primary Examiner.*

U.S. Cl. X.R.

148—1.5, 185, 186